(12) United States Patent
Berman

(10) Patent No.: US 6,297,558 B1
(45) Date of Patent: Oct. 2, 2001

(54) SLURRY FILLING A RECESS FORMED DURING SEMICONDUCTOR FABRICATION

(75) Inventor: Michael J. Berman, West Linn, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/454,257

(22) Filed: Dec. 2, 1999

Related U.S. Application Data

(62) Division of application No. 08/899,111, filed on Jul. 23, 1997, now Pat. No. 6,069,085.

(51) Int. Cl.$^7$ .................................................. H01L 23/48
(52) U.S. Cl. ........................ 257/774; 257/752; 257/773
(58) Field of Search ................................... 257/774, 773, 257/752, 750, 748, 746

(56) References Cited

U.S. PATENT DOCUMENTS

| | | |
|---|---|---|
| 5,064,683 | 11/1991 | Poon et al. . |
| 5,219,462 | 6/1993 | Bruxvoort et al. . |
| 5,245,790 | 9/1993 | Jerbic . |
| 5,265,378 | 11/1993 | Rostoker . |
| 5,310,455 | 5/1994 | Pasch et al. . |
| 5,321,304 | 6/1994 | Rostoker . |
| 5,389,194 | 2/1995 | Rostoker et al. . |
| 5,403,228 | 4/1995 | Pasch . |
| 5,516,400 | 5/1996 | Pasch et al. . |
| 5,624,304 | 4/1997 | Pasch et al. . |
| 5,626,715 | 5/1997 | Rostoker . |
| 5,667,433 | 9/1997 | Mallon . |
| 5,861,055 | 1/1999 | Allman et al. . |
| 5,865,666 | 2/1999 | Nagahara . |
| 5,868,608 | 2/1999 | Allman et al. . |
| 5,882,251 | 3/1999 | Berman et al. . |
| 5,888,120 | 3/1999 | Doran . |
| 5,893,756 | 4/1999 | Berman et al. . |
| 5,948,697 | 9/1999 | Hata . |
| 5,957,757 | 9/1999 | Berman . |
| 6,248,660 * | 6/2001 | Hamanaka et al. .................. 438/629 |

* cited by examiner

Primary Examiner—Roy Potter

(57) ABSTRACT

The present invention advantageously provides a method for filling a recess with a slurry that exhibits electrical properties similar to those of the structure which has the recess. The topological surface that includes the recess may be placed adjacent to a pad on which the slurry is disposed. The pad may be rotated to force the slurry into the recess. After the slurry is densely packed into the recess, the slurry may be cleaned from the topological surface exclusive of the recess. The slurry may be heated in order to remove the liquid portion of the slurry. The resulting topological surface is planar since a recess no longer exists therein. The technique hereof may be especially usefull for filling a recess that forms in the surface of a plug or in the surface of a fill dielectric disposed within a trench. Such recesses may form as a result of CMP or etchback.

6 Claims, 4 Drawing Sheets

SLURRY FILLING A RECESS FORMED DURING SEMICONDUCTOR FABRICATION

This application is a divisional of 08/899,111 filed Jul. 23, 1997 now U.S. Pat. No. 6,069,085

BACKGROUND OF THE INVENTION

1. Field of the Invention

This invention relates to manufacturing an integrated circuit, and more particularly, to filing a recess with a slurry to enhance reliability of the integrated circuit, the recess having been undesirably formed during fabrication of the integrated circuit.

2. Description of the Related Art

Fabrication of a multi-level integrated circuit involves numerous processing steps. After impurity regions have been deposited within a semiconductor substrate and gate areas defined upon the substrate, interconnect routing is placed on the semiconductor topography and connected to contact areas thereon. An interlevel dielectric is then is formed upon and between the interconnect routing, and more contact areas are formed through the dielectric to the interconnect routing. A second level of interconnect routing is placed upon the interlevel dielectric and coupled to the first level of interconnect routing via the contact areas arranged within the dielectric. Additional levels of interconnect routing and interlevel dielectric may be formed if desired.

Unfortunately, unwanted recesses may form in the topological surface of one or more levels, or layers, employed by an integrated circuit. FIGS. 1–6 demonstrate the formation of such a recess. FIG. 1 depicts a semiconductor topography 10 having a shallow trench 12. Semiconductor topography 10 may be a single crystalline silicon substrate. Shallow trench 12 may be formed by etching away a portion of topography 10. A dielectric material 14, such as an oxide may then be deposited using chemical vapor deposition across the upper surface of topography 10 and into trench 12. Since dielectric material 14 is deposited at a relatively constant late across the entire surface of topography 10, a recess 15 is formed in the surface of dielectric material 14 above trench 12.

FIG. 2 illustrates using, e.g., chemical-mechanical polishing ("CMPW") to remove dielectric material 14 from the upper surface of topography 10 except from within trench 12. A fill dielectric 16 having a relatively planar surface is thus formed within trench 12. Fill dielectric 16 may be used to se doped regions of semiconductor topography 10, and therefore, the fill dielectric is of ten times referred to as the field dielectric. If the shallow trench isolation area is large in area where fill dielectric is formed, certain problems can exist For example, a large recess 15 may cause the CMP polishing pad to conform, under pressure, to the recess. This may enhance the previous recess 15 to that shown in FIG. 2 as recess 18.

A typical CMP process involves placing a semiconductor wafer face-down on a polishing pad which is fixedly attached to a rotatable table or platen. Elevationally extending portions of the downward-directed wafer surface contact with the rotating pad. A fluid-based chemical, of ten referred to as a "slurry" is deposited upon the pad possibly through a nozzle such that the slurry becomes disposed at the interface between the pad and the wafer surface. The slurry initiates the polishing process by chemically reacting with the surface material being polished. The polishing process is facilitated by the rotational movement of the pad relative to the wafer (or vice versa) to remove material catalyzed by the slurry. Unfortunately, if the reaction rate of the slurry with the surface material varies across the surface, certain areas of the wafer may be removed more quickly than others. Also, as described above, a pad which conforms to the wafer, or bows in an arcuate pattern in response to force applied thereto, will undesirably remove some portions of the wafer while leaving others behind. Thus, reaction rate variation and/or pad pressure variation may lead to the formation of recess 18 of FIG. 2 in the upper surface of fill dielectric 16.

FIG. 3 depicts metal interconnects 19 disposed across an interlevel dielectric 15. Interconnects 19 extend are disposed in the same horizontal plane of an integrated circuit Another interlevel dielectric 17 is formed across metal interconnects 19 by the deposition of a dielectric material, such as an oxide. Because interconnects 19 are closely spaced together, voids 21 form in the upper surface of Revel dielectric 17 during the deposition step. The upper surface of interlevel dielectric 17 needs to be a pre-selected distance above the upper surfaces of interconnects 19 to meet design specification. Thus, since voids 21 extend downward and terminate below the upper surfaces of interconnects 19, CMP cannot be used to remove the voids.

Turning to FIG. 4, a semiconductor topography 20 is shown as having a conductive region 22 disposed within an upper portion of topography 20. Semiconductor topography 20 may be a silicon substrate or an interlevel dielectric, depending on the present stage of fabrication. Conductive region 22 may be a doped region within a silicon substrate or an interconnect within an interlevel dielectric. An interlevel dielectric 24 is formed across semiconductor topography 20 and conductive region 22. An opening 26 or "via" may be etched through interlevel dielectric 24 to conductive region 22. A conductive material 28 may be deposited across interlevel dielectric 24 and into opening 26, resulting in the formation of a recess 30 in the upper surface of conductive material 28 above opening 26. As shown in FIG. 5, a contact region or plug 32 is formed exclusively within opening 26 by using CMP to remove conductive material 28 form all areas except opening 26. Unfortunately, a recess 34 forms in the upper surface of plug 32 as a result of CMP. As described in U.S. Pat. No. 5,340,370 (herein incorporated by reference), the chemical species of CMP used to catalyze the conductive material may overly react with the material and cause recesses 34 within the material upper surface.

FIG. 6 illustrates yet another situation Ye recess formation is a problem. A plug 33 is formed upon a conductive region 23 that is disposed within a semiconductor topography 21. A conductive material, such as tungsten is deposited into an opening that extends vertically through an interlevel dielectric 25, resulting in plug 33. Unfortunately, during deposition of the plug material, a recess 35 forms in the upper surface of the plug that extends below the upper surface of interlevel dielectric 25. Such a recess may develop because deposition occurs at the same rate upon the bottom of the opening as upon the sides of the opening. Recess 35 cannot be removed by the CMP process because it extends below the surface of interlevel dielectric 25.

Alternatively, conductive material 28 may be removed using solely a chemical etchant. The chemical etchant may overly attack the conductive material when attempts to form a plug 34 of substantially planar upper surface. Accordingly, a recess 30 present in the upper surface of conductive material 28 before the etch process (see FIG. 4) is translated to a recess 34 in the upper surface of plug 34 post etch.

The above descriptions of the formation of recesses are only examples of many fabrication steps which might lead to recess formation. Such recesses may, among others, cause step coverage problems when layers of material are formed across surfaces having recesses. Step coverage is defined as a measure of how well a film conforms over an underlying step and is expressed by the ratio of the minimum thickness of a film as it crosses a step to the nominal thickness of the film on horizontal regions. In general, the height of the step, e.g., the depth of the recess, and the aspect ratio of the features being covered, e.g., the depth to width ratio of the recess, affect the step coverage. The greater the step height or the aspect ratio, the more difficult it is to achieve coverage of the step without a corresponding thinning of the film that overlies the step. Furthermore, when a recess is present in a plug, the non-planarity of the surface of the plug may impair the ability to print high resolution lines during later photolithography steps. Thus, properly aligning interconnects to these plugs may be difficult Additionally, a recess may cause the formation of voids or open circuits in the interconnects formed above the recess. Such disadvantages caused by plug recesses are even more of a problem when multiple layers are formed in which plugs with recesses overly each other.

It would therefore be desire to develop a process for planarizing the surface of a structure employed by an inked circuit A process is needed which would obviate recesses upon the surface of either a conductive material or a dielectric. Such a process would provide for better step coverage and for better resolution of photolithography lines. The process would also inhibit shorting between certain structures separated by a fill dielectric.

SUMMARY OF THE INVENTION

The problems outlined above are in large part solved by the recess removal technique hereof. The present invention advantageously provides a method for filling a recess with a slurry that exhibits electrical properties similar to those of the structure which has the recess. The slurry is forced into the recess with a polishing pad similar to that used for CMP, but for an altogether different purpose. The slurry that is placed within the recess is preferably composed of materials that do not attach (i.e., catalyze or etch) with the surface material of the recess. Thus, the structure having the recess is not further subtracted by the addition of the slurry but is rather built up with the additional slurry being forced exclusively into the recess. After the slurry is densely packed into the recess, steps are performed to ensure that the slurry particles are permanently arranged within the recess. Using the technique hereof, a structure that once had a non-planar surface may be transformed into a store that has a planar surface. For example, the improved store may provide for better step coverage since the step created by the recess no longer exists. Moreover, shorting between layers lying above and below the structure is no longer a concern since the recess that once promoted such shorting ceases to exist. Thus, the reliability of an integrated circuit can be improved by removing unwanted recesses that form during fabrication of the integrated circuit.

In an embodiment, a topological surface of a structure formed during the fabrication of an integrated circuit includes a recess. A slurry may be placed upon a pad which is then placed adjacent to the topological surface. The pad simultaneously rotates and applies pressure to the slurry to force the slurry into the recess. After the slurry is mechanically forced, or densely packed, within the recess, the topological surface is removed from the polishing pad. The remaining slurry is then removed from all areas of the topological surface except from within the recess. The topological surface may be exposed to thermal radiation to remove the solvent of the slurry, thereby curing the slurry so that it may permanently remain within the recess.

The technique hereof may be used to fill a recess in the surface of a plug extending through an interlevel dielectric. The recess may be filled with a slurry made of low resistivity particles amalgamated with an inert liquid, such as water. Because of the high density of the interlevel dielectric and the relative low density of the plug, the slurry particles extend predominantly into the upper region of the plug. Since the slurry particles do not substantially enter the interlevel dielectric, the high resistivity of the dielectric is unaffected by the slurry. If any slurry particles enter the interlevel dielectric surface, they can be removed in a subsequent etch cycle which is highly selective to the interlevel dielectric and not the laterally adjacent plug. Alternately, a slurry having high resistivity particles suspended in an inert liquid may be used to fill a recess in the surface of a fill dielectric. Using a slurry to fill a recess may also be necessary in other conductive and non-conductive structures employed by an integrated circuit

BRIEF DESCRIPTION OF TEE DRAWINGS

Other objects and advantages of the invention will become apparent upon reading the following detailed description and upon reference to the accompanying drawings in which.

Figure 1:
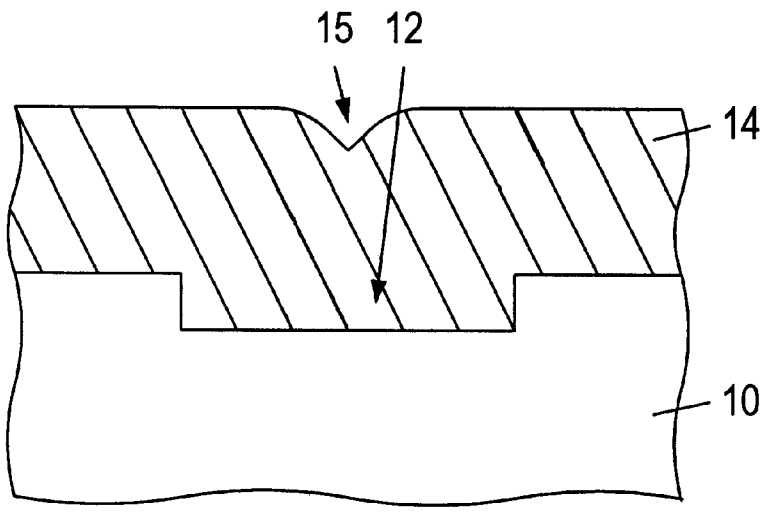
FIG. 1 depicts a cross-sectional view of a semiconductor topography in which a dielectric material is disposed upon a topological surface having a trench, wherein a recess in the upper surface of the dielectric material forms during the deposition of the material.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
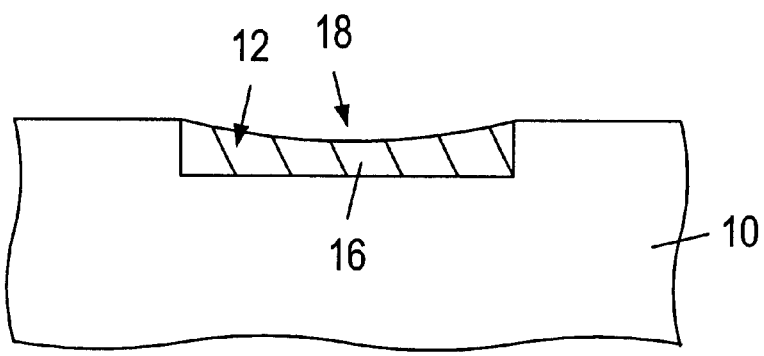
FIG. 2 depicts a cross-sectional view of the semiconductor topography, wherein CMP is used to remove the dielectric material from above the topological surface exclusive of the trench such that a fill dielectric is formed within the trench having a recess in the upper surface of the fill dielectric as a result of CMP.
Figure 3:
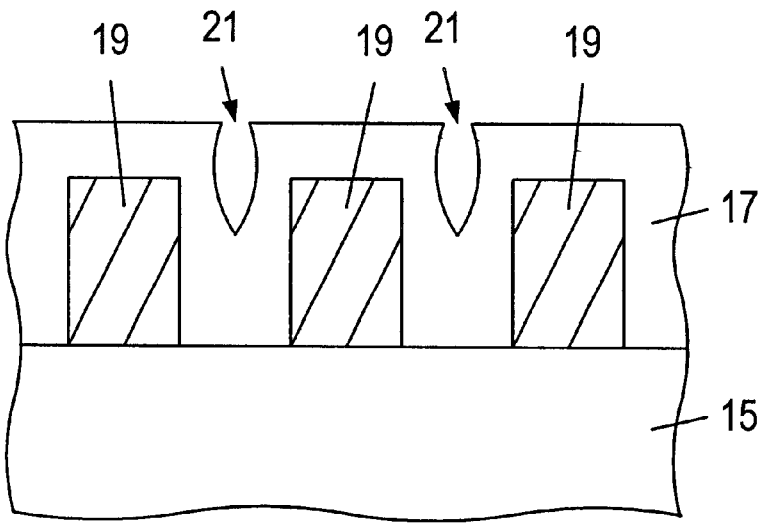
FIG. 3 depicts a partial cross-sectional view of a semiconductor topography in which a dielectric material is deposited across metal interconnects lying in the same horizontal plane, wherein recesses form in the upper surface of the dielectric material between the interconnects.
Figure 4:
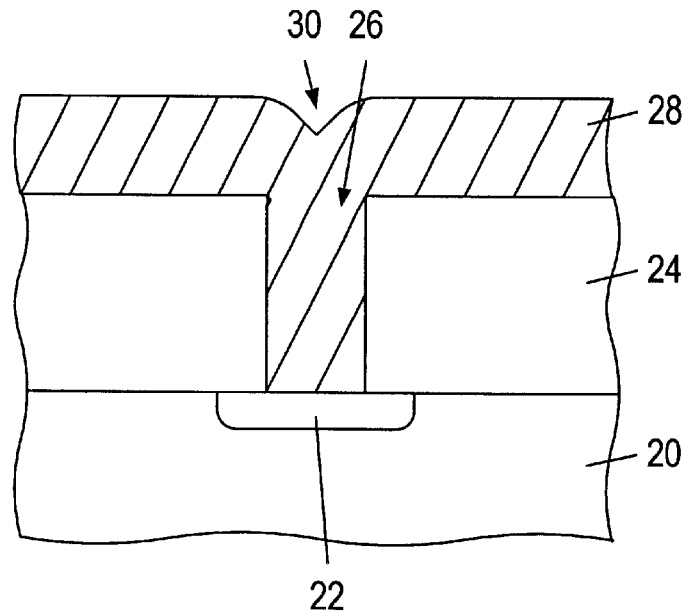
FIG. 4 depicts a cross-sectional view of a semiconductor topography in which a conductive material is disposed within an opening through an interlevel dielectric and upon the interlevel dielectric, wherein a recess forms in the upper surface of the conductive material during deposition of the material.
Figure 7B:
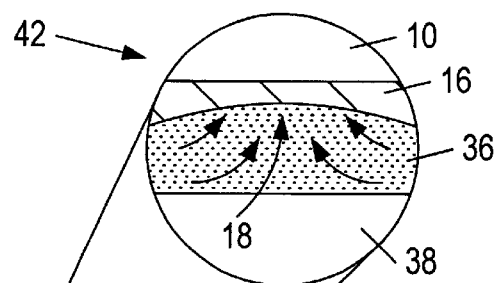
FIG. 7b depicts a detailed view along section 42 of FIG. 7 in which slurry particles are moving within the recess toward the fill dielectric.
Figure 7A:
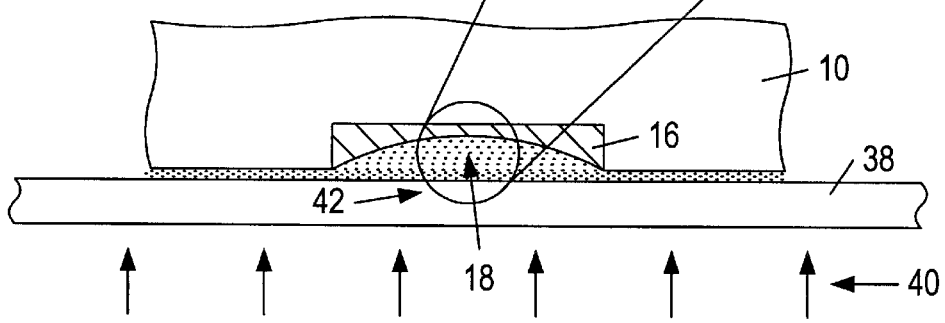
FIG. 7a depicts a cross-sectional view of a pad forcing a slurry into a recess of the surface of a fill dielectric disposed within a shallow trench of a silicon-based substrate.

FIG. 7a depicts the removal of recess 18 of the semiconductor topography that was previously presented in FIG. 2. Recess 18 of the semiconductor topography presented in FIG. 3 may also undergo a similar removal procedure. As shown, the frontside surface of semiconductor topography 10 may be placed adjacent to a pad 38 on which a slurry 36 is disposed, thereby positioning slurry 36 between pad 38 and recess 18. Slurry 36 may be composed of particles contained within a neutral solution, such as deionized water that does not react with, or further remove, fill dielectric 16 or with semiconductor topography 10. The particles of slurry 36 preferably exhibit high resistivity. Examples of appropriate particles may be silica or alumina (a ceramic). Pad 38 rotates while applying pressure to slurry 36. Force 40 may be distributed evenly across semiconductor topography 10 by pad 38. Force 40 is applied perpendicularly toward semiconductor topography 10 in order to force slurry 36 into recess 18. Therefore, pad 38 may be used to densely pack slurry 36 within recess 18 until slurry 36 completely fills recess 18. FIG. 7b illustrates a detailed view along section 42 of FIG. 7a The migration of particles of slurry 36 toward recess 18 is shown The rotation motion of pad 38 causes even those particles that are not directly adjacent to recess 18 to move in a direction toward the recess.

Figure 5:
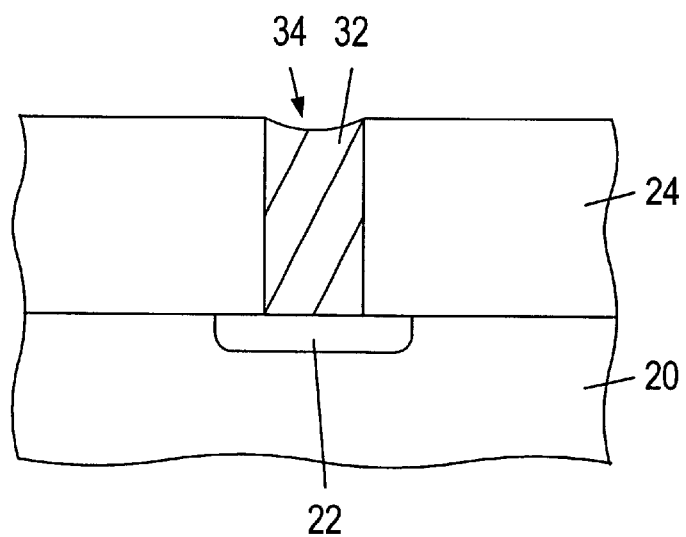
FIG. 5 depicts a cross-sectional view of the semiconductor topography in which CMP is used to remove the conductive material from above the interlevel dielectric exclusive of within the opening such that a plug is formed within the opening, wherein a recess forms in the upper surface of the plug as a result of CMP.
Figure 6:
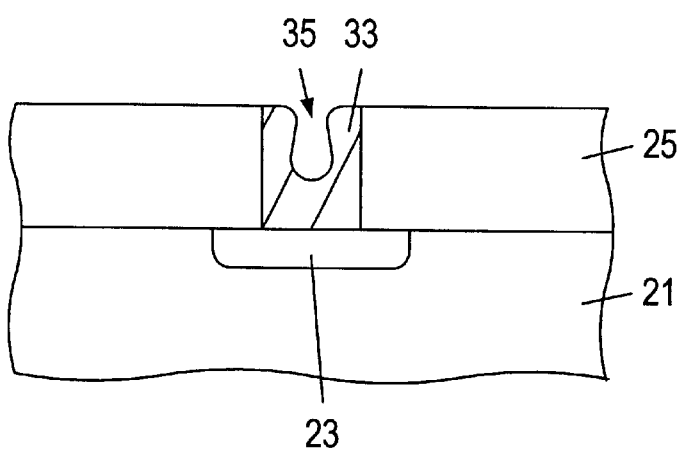
FIG. 6 depicts a cross-sectional view of a semiconductor topography in which a plug is formed by depositing a metal into an opening that extends through an interlevel dielectric, wherein a recess forms in the upper surface of the plug as a result of the deposition.
Figure 8B:
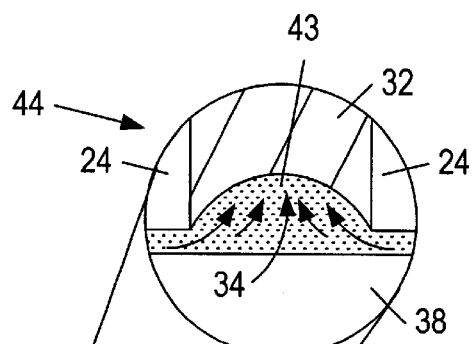
FIG. 8b depicts a detailed view along section 44 of FIG. 8a in which slurry particles are moving within the recess toward the plug.
Figure 8A:
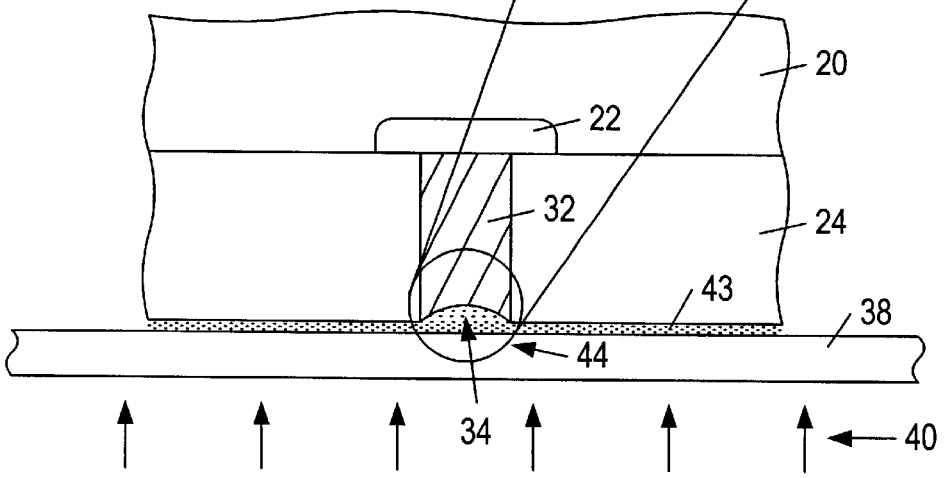
FIG. 8a depicts a cross sectional view of a pad forcing a slurry into a recess of the surface of a plug extending through an interlevel dielectric.

FIG. 8a depicts pad 38 being used to force a slurry 43 into recess 34 of the semiconductor topography previously shown in FIG. 5. Slurry 43 may be similarly forced into recess 34 of the semiconductor topography presented in FIG. 6. Slurry 43 is interposed between pad 38 and the frontside surface of interlevel dielectric 24 and plug 32. Slurry 43 may be composed of particles that exhibit low resistivity, e.g., aluminum or tungsten particles. The slurry particles may be combined with a liquid, such as deionized water that is chemically inert to the material of plug 32 and to interlevel dielectric 24. As force field 40 is applied perpendicularly to slurry 43 by rotation pad 38, slurry 36 becomes densely packed within recess 34 of plug 32.

The migration of slurry particles toward recess 34 is depicted in FIG. 8b, which is a detailed view along section 44 of FIG. 8a. Some of the slurry particles may become positioned within plug 32 at the plug/slurry interface. The density of the material employed by plug 32 is such that the atoms within the plug material are spaced far enough apart to allow slurry particle atoms to move to interstitial positions between the plug atoms. Fortunately, slurry particles cannot become positioned within interlevel dielectric 24 because the atoms of the dielectric are so closely spaced that slurry particle are unable to migrate into dielectric 24. Thus, the highly conductive slurry particles are incapable of adversely decreasing the resistivity of interlevel dielectric 24.

Figure 9:
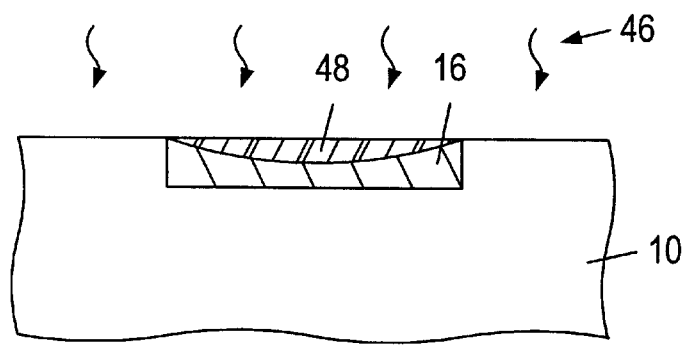
FIG. 9 depicts a cross-sectional view of the semiconductor topography of FIG. 7a, wherein excess slurry is removed from the surface of the silicon-based substrate except from within the recess of the fill dielectric, and wherein the semiconductor topography is exposed to thermal radiation to cure the slurry.

Turning to FIG. 9, slurry 36 is removed from all areas of the semiconductor topography depicted in FIG. 7a except from within the shallow trench of topography 10. A cleaning process used to remove excess slurry may involve spraying the slurry with deionized water and using a high pressure scrubber to remove the slurry. For example, an ammonia scrubber may be used. Semiconductor topography 10 is then exposed to thermal radiation 46 to remove the liquid portion of slurry 36 from the solid portion. A high resistivity solid structure 48 thus results and is arranged within the trough of topography 10 such that the surface of structure 48 lies in the same elevational plane as the surface of topography 10. The overall upper surface that combines the upper surfaces of topography 10 and structure 48 is relatively planar.

Figure 10:
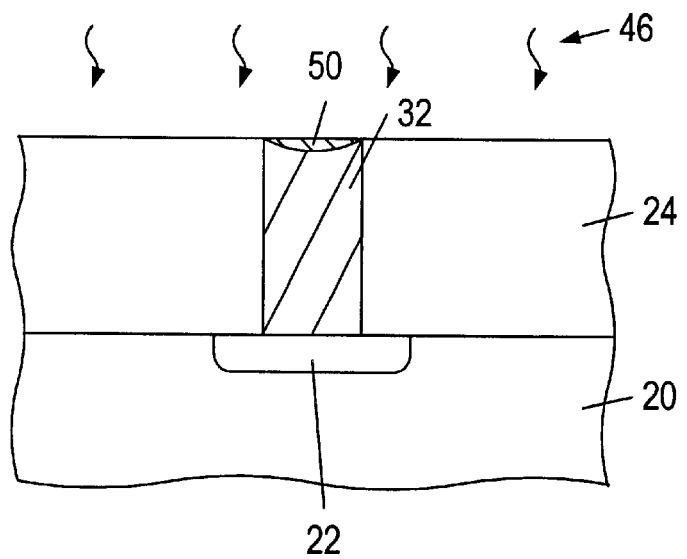
FIG. 10 depicts a cross-sectional view of the semiconductor topography of FIG. 8a, wherein excess slurry is removed from the surface of the interlevel dielectric except from within the recess of the plug, and wherein the semiconductor topography is exposed to thermal radiation to cure the slurry.

FIG. 10 illustrates the semiconductor topography shown in FIG. 8a after slurry 43 is removed from areas exclusive of within the via extending through interlevel dielectric 24. Thermal radiation 46 is used to cure slurry 43 so that a low resistivity solid structure 50 remains configured above plug 32 within the via. The resulting overall upper surface that includes both the upper surfaces of interlevel dielectric 24 and structure 50 is relatively planar.

Figure 11:
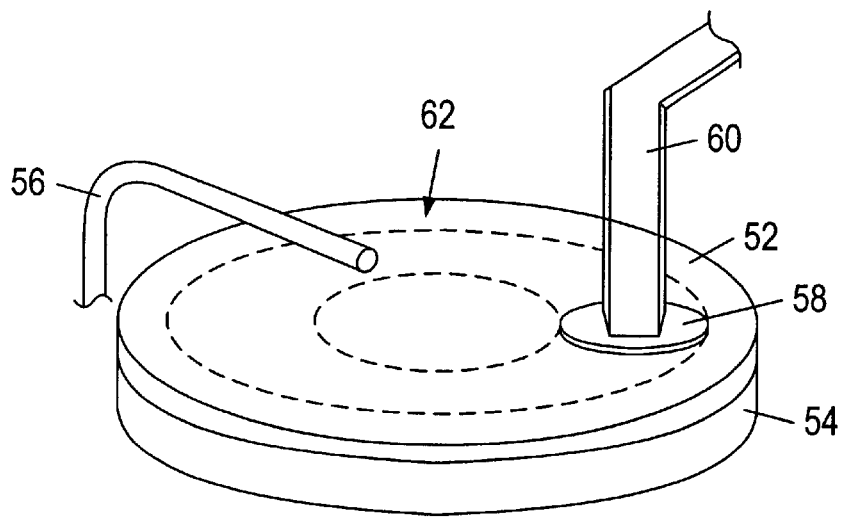
FIG. 11 depicts an embodiment of an apparatus used to force a slurry into a recess in the topological surface of a structure employed by an inter circuit.

Turning to FIG. 11, an embodiment of an apparatus that may be used to force a slurry into a recess of a topological surface is depicted. A symmetrical pad 52 may be fixedly attached to a rotatable platen 54 Pad 52 may be made of various substances that are both resilient and, to a lesser extent, conformal. The weight, density, and hardness of pad 52 may vary, depending on the tape of slurry being pressed by pad 52. Pad 52 may comprise polyurethane which, in most instances, does not include an overlying fabric material. Preferably, a somewhat hard pad is used to ensue that pad 52 applies a constant amount of pressure across a topological surface. An example of such a hard pad is the IC-1000 pad commercially available from Rodel Corporation. A relatively soft pad, such as the Suba 500 pad manufactured by Rodel Corp. may also be used, but a stiff material attached to the backside of the pad may be required to prevent pad 52 from bending and applying different amounts of pressure across a topological surface.

A conduit 56 that terminates above pad 52 may be used to apply a slurry to the surface of pad 52. Conduit 56 preferably dispenses the slurry onto the center of pad 52 so that the slurry is evenly distributed outward from the center as pad 52 is rotated by platen 54. A wafer may be placed face down on pad 52 in the center of a track 62 that is defined by the rotational movement of pad 52. An arm 60 mounted to the backside of wafer 58 preferably holds wafer 58 as pad 52 rotates to move wafer 58 to different positions along track 62.

Various other embodiments of such an apparatus may be contemplated. Particularly, apparatuses that are used for CMP may also be used to force a slurry into a recess. U.S. Pat. No. 5,421,769 to Schultz et al. and U.S. Pat. No. 5,536,202 to Appel et al. describe such apparatuses. Alternately, an apparatus employed for the present technique may include a pad large enough to hold multiple wafers at once. These wafers may be moved in various patterns around the pad in an attempt to prevent repeatedly using the same areas of the pad. In yet another embodiment, the slurry may rise to the surface of the pad through pores in the pad.

It will be appreciated to those skilled in the art having the benefit of this disclosure that this invention is believed to be capable of planarizing topological surfaces that have recesses, such topological surfaces belonging to the various levels of an integrated circuit. It is intended that the following claims be interpreted to embrace all such modifications and changes and, accordingly, the specification and drawings are to be regarded in an illustrative rather than a restrictive sense.

What is claimed is:

1. An integrated circuit, comprising:
    a conductive plug extending through an interlevel dielectric and terminating in a semiconductor topography, said conductive plug comprising a topological surface having a recess; and
    slurry particles embedded by mechanical force almost exclusively within said recess to an elevation level commensurate with the remaining topological surface of the plug.

2. The integrated circuit of claim 1, wherein said slurry particles are low resistivity particles.

3. The integrated circuit of claim 1, wherein said slurry particles form a conductive structure, said conductive structure comprising an upper surface that is substantially flush with a surface of said interlevel dielectric.

4. An integrated circuit, comprising:
    a fill dielectric arranged within a trench, said trench being disposed within a semiconductor topography, said fill dielectric comprising a topological surface having a recess and;
    slurry particles embedded with mechanical force almost exclusively with said recess to an elevation level commensurate with the remaining topological surface of the fill dielectric.

5. The integrated circuit of claim 4, wherein said slurry particles are high resistivity particles.

6. The integrated circuit of claim 4, wherein said slurry particles form an insulation structure, said insulation structure comprising an upper surface that is substantially flush with a surface of said semiconductor topography.

* * * * *